United States Patent
Yoshida

(10) Patent No.: US 11,463,081 B2
(45) Date of Patent: Oct. 4, 2022

(54) DRIVING CIRCUIT AND SEMICONDUCTOR MODULE

(71) Applicant: Mitsubishi Electric Corporation, Tokyo (JP)

(72) Inventor: Hiroshi Yoshida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 51 days.

(21) Appl. No.: 16/774,671

(22) Filed: Jan. 28, 2020

(65) Prior Publication Data

US 2021/0013877 A1     Jan. 14, 2021

(30) Foreign Application Priority Data

Jul. 8, 2019   (JP) .............................. JP2019-127043

(51) Int. Cl.
*H03K 17/082* (2006.01)
*H03K 17/16* (2006.01)
*H03K 17/60* (2006.01)
*H03K 17/567* (2006.01)

(52) U.S. Cl.
CPC ....... *H03K 17/0822* (2013.01); *H03K 17/165* (2013.01); *H03K 17/567* (2013.01); *H03K 17/602* (2013.01)

(58) Field of Classification Search
CPC ............. H03K 17/0822; H03K 17/602; H03K 17/567; H03K 17/165
See application file for complete search history.

(56) References Cited

U.S. PATENT DOCUMENTS

| | | | |
|---|---|---|---|
| 5,327,131 A | 7/1994 | Ueno et al. | |
| 6,222,403 B1 | 4/2001 | Mitsuda | |
| 2011/0241738 A1* | 10/2011 | Tamaoka | H03K 17/164 327/109 |
| 2014/0055190 A1* | 2/2014 | Kaneko | H03K 17/168 327/376 |
| 2018/0048302 A1 | 2/2018 | Hokazono et al. | |

FOREIGN PATENT DOCUMENTS

| | | |
|---|---|---|
| JP | H05-199116 A | 8/1993 |
| JP | H11-346147 A | 12/1999 |
| JP | 2014-222991 A | 11/2014 |
| WO | 2016/207956 A1 | 12/2016 |

OTHER PUBLICATIONS

An Office Action mailed by the Japanese Patent Office dated Aug. 23, 2022, which corresponds to Japanese Patent Application No. 2019-127043 and is related to U.S. Appl. No. 16/774,671; with English language translation.

* cited by examiner

*Primary Examiner* — Metasebia T Retebo
(74) *Attorney, Agent, or Firm* — Studebaker & Brackett PC

(57) ABSTRACT

A driving circuit includes first and second driving units connected in parallel to each other, wherein both the first and second driving units start to supply a gate current to a gate of a switching device in a turn-on operation of the switching device, when a gate voltage of the switching device increases and has reached a threshold voltage of the switching device, the first driving unit continues to supply the gate current, and the second driving unit stops supply of the gate current before the gate voltage has reached the threshold voltage.

15 Claims, 4 Drawing Sheets

FIG. 1
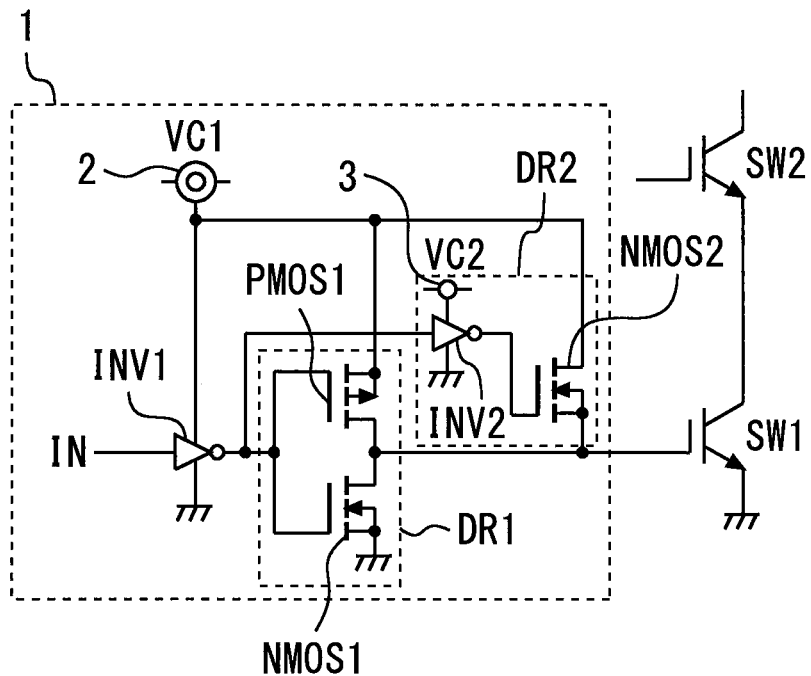
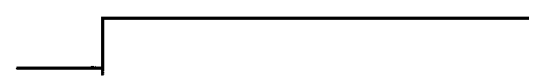
FIG. 2A
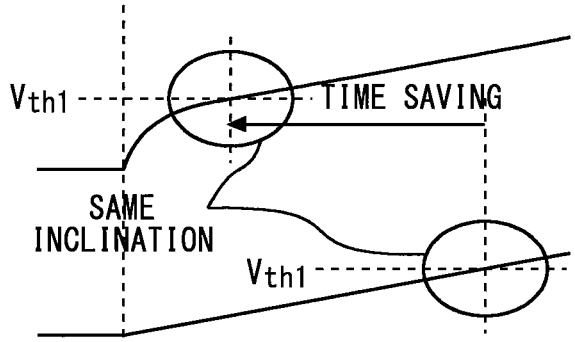
FIG. 2B
FIG. 2C
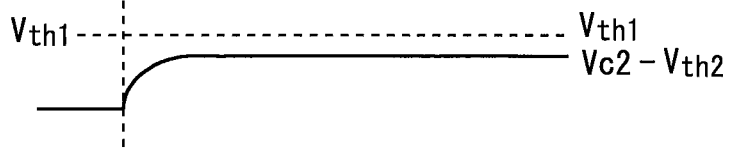
FIG. 2D

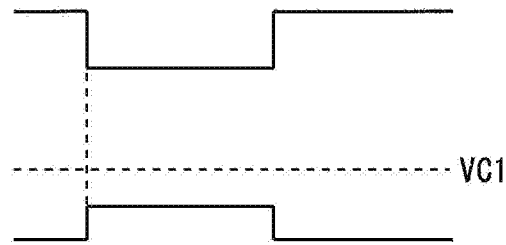
FIG. 5A
FIG. 5B
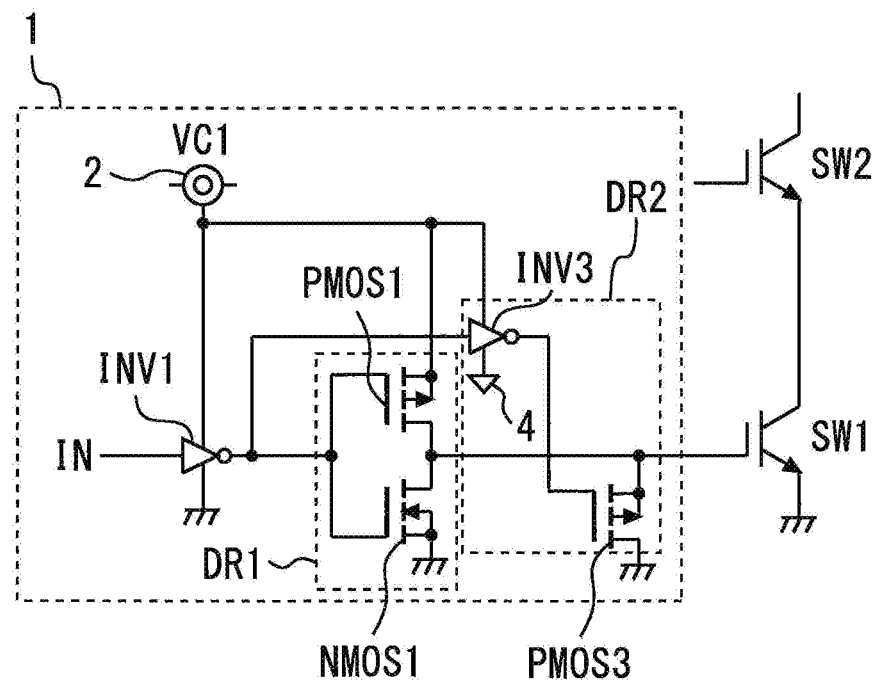
FIG. 6

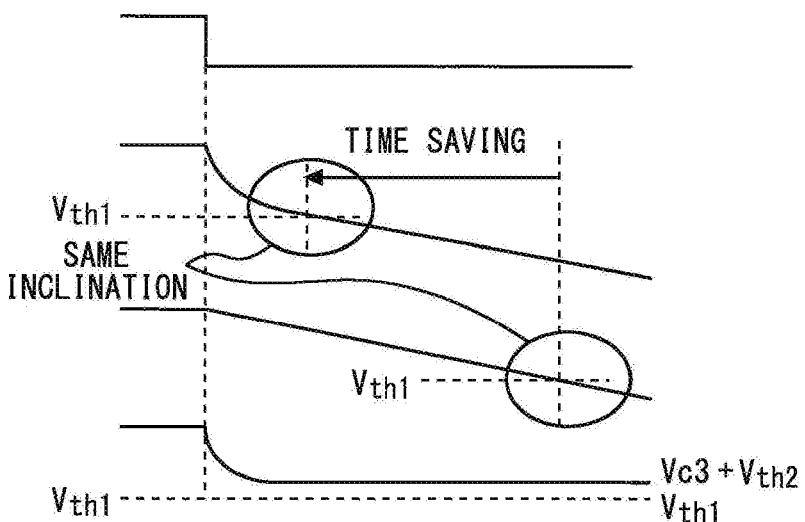
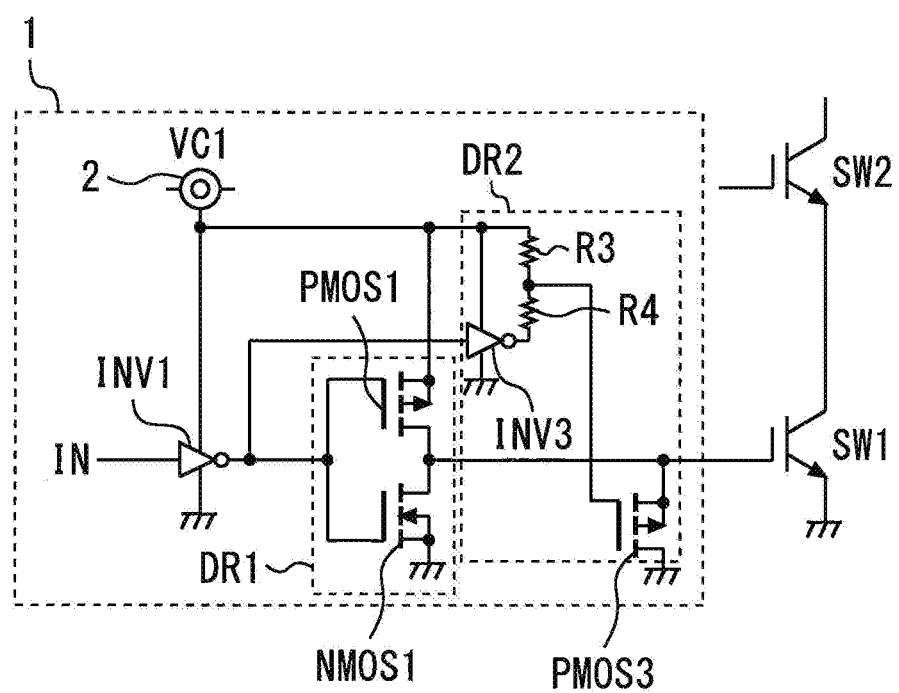

DRIVING CIRCUIT AND SEMICONDUCTOR MODULE

BACKGROUND OF THE INVENTION

Field

The present invention relates to a driving circuit for driving a switching device such as IGBT or the like, and a semiconductor module.

Background

When a drive circuit supplies an output current to a gate of a switching device, a gate voltage gradually increases. When the gate voltage exceeds a threshold voltage of the switching device, the switching device is switched from an off-state to an on-state. There has been proposed a technique in which a gate voltage to be supplied to a switching device having a low threshold voltage is reduced when a plurality of switching devices are driven, thereby preventing breakdown caused by current concentration (for example, see Patent Literature 1: International Publication No. WO2016/207956 (FIG. 2)). In Patent Literature 1, NchMOS 36 and PchMOS 50 generate output current. Both of the NchMOS 36 and the PchMOS 50 presuppose that the switching device is turned on, and continue to retain current output capability even after the gate voltage has reached the threshold voltage of the switching device.

SUMMARY

When the output current of the drive circuit is large at the time of turn-on of the switching device, rising of the gate voltage becomes steep, and a collector current starts to flow rapidly, so that switching noise increases. In order to prevent this, it is necessary to suppress dv/dt when the gate voltage exceeds the threshold voltage of the switching device by limiting the output current of the drive circuit. However, the limitation of the output current causes increase of a period of time from a time when the drive circuit starts current supply until the gate voltage has exceeded the threshold voltage of the switching device. Usually, since the switching device is in an off-state during this period of time, a switching loss increases as this period of time is longer.

The present invention has been made to solve the above-described problem, and has an object to achieve a drive circuit and a semiconductor module that are capable of reducing switching loss while suppressing switching noise.

A driving circuit according to the present invention includes first and second driving units connected in parallel to each other, wherein both the first and second driving units start to supply a gate current to a gate of a switching device in a turn-on operation of the switching device, when a gate voltage of the switching device increases and has reached a threshold voltage of the switching device, the first driving unit continues to supply the gate current, and the second driving unit stops supply of the gate current before the gate voltage has reached the threshold voltage.

In the present invention, both the first and second driving units start to supply the gate current in the turn-on operation of the switching device. Therefore, the period of time from the time when the drive circuit starts current supply until the gate voltage has exceeded the threshold voltage of the switching device is shortened. As a result, the switching loss can be reduced. Even when the gate voltage increases and has reached the threshold voltage, the first driving unit continues to supply the gate current. On the other hand, the second driving unit stops supply of the gate current before the gate voltage has reached the threshold voltage. Accordingly, the gate voltage slowly exceeds the threshold voltage when the switching device is turned on. As a result, switching noise occurring when the switching device is turned on can be suppressed.

Other and further objects, features and advantages of the invention will appear more fully from the following description.

BRIEF DESCRIPTION OF DRAWINGS

FIG. 1 is a circuit diagram showing a semiconductor module according to a first embodiment.

FIGS. 2A to 2D show a timing chart of an operation of the semiconductor module according to the first embodiment.

FIGS. 5A and 5B show a timing chart of an operation of the preamplifier of the second driving unit according to the second embodiment.

FIG. 6 is a circuit diagram showing a semiconductor module according to a third embodiment.

FIGS. 7A to 7D show a timing chart of an operation of the semiconductor module according to the third embodiment.

FIG. 8 is a circuit diagram showing a semiconductor module according to a fourth embodiment.

DESCRIPTION OF EMBODIMENTS

Figure 3:
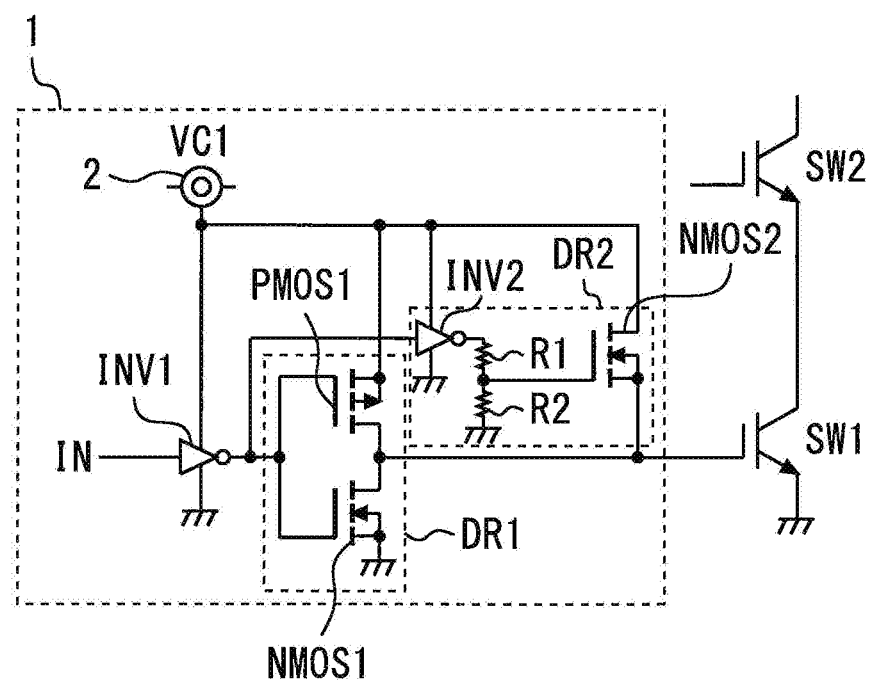
FIG. 3 is a circuit diagram showing a semiconductor module according to a second embodiment.

A driving circuit and a semiconductor module according to the embodiments of the present invention will be described with reference to the drawings. The same components will be denoted by the same symbols, and the repeated description thereof may be omitted.

First Embodiment

FIG. 1 is a circuit diagram showing a semiconductor module according to a first embodiment. This semiconductor module is used, for example, when AC power is converted into DC power and then converted back into AC power. Switching devices SW1 and SW2 are cascode-connected to each other. The switching devices SW1 and SW2 are power devices such as IGBTs, MOSFETs, or SiCMOSFETs, and use, as a power supply, a voltage generated by boosting a voltage from a commercial power supply.

A drive circuit 1 is a control integrated circuit that biases a gate of the switching device SW1 according to an input signal IN and controls the switching device SW1 to be turned on or off. The drive circuit 1 includes an inverter INV1 which is a preamplifier, and first and second driving units DR1 and DR2 connected in parallel to each other. The inverter INV1 logically inverts the input signal IN. The first and second driving units DR1 and DR2 supply a gate current to the gate of the switching device SW1 according to an output signal of the inverter INV1. The power supply of INV1 is a power supply 2 of the drive circuit 1.

The first driving unit DR1 includes an NMOS transistor NMOS1 and a PMOS transistor PMOS1 connected in parallel to each other. The gates of NMQS1 and PMOS1 are connected to the output of inverter INV1. The source of NMOS1 is connected to GND. The source of the PMOS1 is connected to the power supply 2. The drain of NMOS1 and the drain of PMOS1 are connected to the gate of switching device SW1.

The second driving unit DR2 includes an NMOS transistor NMOS2, an inverter INV2 that is a preamplifier for driving the NMOS2, and a power supply 3 on a high potential side of the inverter INV2. The inverter INV2 logically inverts an output signal of the inverter INV1. The gate of NMOS2 is connected to the output of inverter INV2. The drain of the NMOS2 is connected to the power supply 2 of the drive circuit 1. The source of NMOS2 is connected to the gate of switching device SW1. In the drive circuit 1, the power supply 3 generates a voltage VC2 lower than the voltage VC1 of the power supply 2 of the drive circuit 1.

A high output voltage of INV2 becomes the voltage VC2 of the power supply 3 of INV2. The gate of NMOS2 is biased with this voltage VC2, and the gate of switching device SW1 is biased with a source voltage of NMOS2. The gate-source voltage Vgs of NMOS2 is equal to the difference between the voltage VC2 and the gate voltage Vg of the switching device SW1. Therefore, when the gate voltage Vg of the switching device SW1 increases to be higher than the difference between the voltage VC2 and a threshold voltage Vth2 of NMOS2 (Vg>VC2−Vth2), Vgs decreases to be smaller than Vth2, so that NMOS2 is turned off and thus no gate current is supplied to the switching device SW1. Therefore, as the voltage VC2 of the power supply 3 of INV2 is lowered, the current supply by the second driving unit DR2 is stopped with a lower gate voltage Vg.

In the present embodiment, the voltage VC2 of the power supply 3 of INV2 is set to be lower than a total voltage obtained by summing the threshold voltage Vth1 of the switching device SW1 and the threshold voltage Vth2 of the NMOS2. As a result, the second driving unit DR2 loses its output capability before the gate voltage Vg of the switching device SW1 has reached the threshold voltage Vth1, and stops supply of the gate current.

FIGS. 2A to 2D show a timing chart of an operation of the semiconductor module according to the first embodiment. FIG. 2A shows a waveform of an input signal IN for turning on the switching device SW1, FIG. 2B shows a gate bias waveform of the switching device SW1, FIG. 2C shows a gate bias waveform in the case of only the first driving unit DR1, FIG. 2D shows a gate bias waveform in the case of only the second driving unit DR2, and the waveform of FIG. 2B is a waveform obtaining by summing the waveform of FIG. 2C and the waveform of FIG. 2D.

When a high signal is input as the input signal IN, the drive circuit 1 performs an operation of turning on the switching device SW1. In this turn-on operation of the switching device SW1, PMOS1 and NMOS2 are turned on to increase the gate voltage of the switching device SW1. Since both the first and second driving units DR1 and DR2 start to supply the gate current as described above, the period of time from the time when the drive circuit 1 starts current supply until the gate voltage has exceeded the threshold voltage Vth1 of the switching device SW1 is shortened. As a result, the switching loss can be reduced.

Thereafter, even when the gate voltage increases and has reached the threshold voltage Vth1, the first driving unit DR1 continues to supply the gate current. On the other hand, the second driving unit DR2 stops supply of the gate current before the gate voltage has reached the threshold voltage Vth1. Therefore, the increasing speed of the gate voltage when the gate voltage exceeds the threshold voltage Vth1 is the same as that in the case of only the first driving unit DR1. Accordingly, the gate voltage slowly exceeds the threshold voltage Vth1 when the switching device SW1 is turned on. As a result, switching noise occurring when the switching device SW1 is turned on can be suppressed. However, it is necessary to limit the output of PMOS1 so that the switching noise is equal to an allowable value.

Second Embodiment

Figure 4:
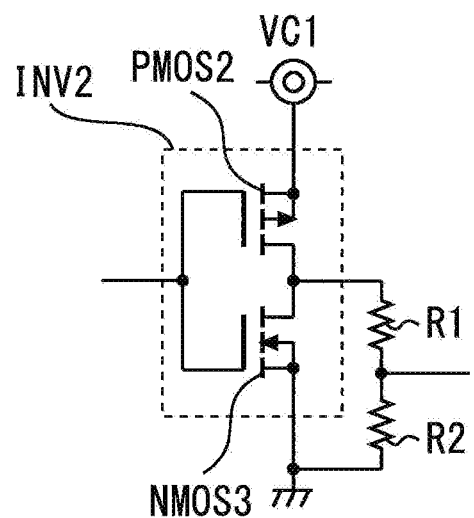
FIG. 4 is a circuit diagram showing a preamplifier of the second driving unit according to the second embodiment.

FIG. 3 is a circuit diagram showing a semiconductor module according to a second embodiment. FIG. 4 is a circuit diagram showing a preamplifier of the second driving unit according to the second embodiment. INV2 includes a PMOS transistor PMOS2 and an NMOS transistor NMOS3 which are connected in parallel to each other. Unlike the first embodiment, the power supply of INV2 is not the power supply 3, but the power supply 2 of the drive circuit 1. A voltage dividing circuit in which resistors R1 and R2 are connected in series is provided between the output of INV2 and GND as a reference potential. The connection point between the resistors R1 and R2 is connected to the gate of NMOS2. Other configurations are the same as those in the first embodiment.

FIGS. 5A and 5B show a timing chart of an operation of the preamplifier of the second driving unit according to the second embodiment. FIG. 5A shows a waveform of the input voltage of INV2, FIG. 5B shows a waveform of the voltage at the connection point between the resistors R1 and R2, that is, the gate voltage of the NMOS2. The voltage at the connection point between the resistors R1 and R2 is lower than the voltage VC1 of the power supply 2 of the drive circuit 1 due to resistance division.

The voltage at the connection point between the resistors R1 and R2 is set to be lower than the total voltage obtained by summing the threshold voltage Vth1 of the switching device SW1 and the threshold voltage Vth2 of NMOS2. As a result, the second driving unit DR2 loses its output capability before the gate voltage Vg of the switching device SW1 has reached the threshold voltage Vth1, and stops supply of the gate current. Therefore, the second embodiment can obtain the same effect as the first embodiment. Furthermore, since it is not necessary that the power supply 3 is separately provided like the first embodiment, the circuit configuration is more simplified. In addition, by setting the resistance values of resistors R1 and R2 to appropriate values, a voltage corresponding to the voltage VC2 of the power supply 3 can be easily set.

Third Embodiment

FIG. 6 is a circuit diagram showing a semiconductor module according to a third embodiment. The drive circuit 1 performs a turn-off operation of the switching device SW1 by discharging charges accumulated at the gate of the switching device SW1. The third embodiment is different from the first embodiment in the configuration of the second drive circuit DR2.

The second drive circuit DR2 includes a PMOS transistor PMOS3, INV3 which is a preamplifier for driving PMOS3, and a power supply 4 on a low potential side of INV3. The source of PMOS3 is connected to GND. The drain of PMOS2 is connected to the gate of the switching device SW1. The gate of PMOS2 is connected to the output of INV3. Other configurations are the same as those in the first embodiment.

The power supply on a high potential side of INV3 is the power supply 2 of the drive circuit 1. A power supply 4 is used as the power supply on the low potential side of INV3.

In the drive circuit 1, the power supply 4 generates a voltage VC3 higher than the GND of the drive circuit 1.

The low output voltage of INV3 becomes a voltage VC3 of the power supply 4 which is a reference potential of INV3. The gate of PMOS3 is biased with the voltage VC3, and when PMOS3 is turned on, charges accumulated in the gate of the switching device SW1 are discharged. The gate-source voltage Vgs of PMOS3 is equal to the difference between the gate voltage Vg of the switching device SW1 and VC3. Therefore, when the gate voltage Vg of the switching device SW1 decreases to be lower than the sum of the voltage VC3 and a threshold voltage Vth3 of PMOS3 (Vg<VC3+Vth3), Vgs becomes smaller than Vth3, so that PMOS3 is turned off and does not discharge charges. Accordingly, as the voltage VC3 which is the reference potential of INV3 is made higher, discharging by the second driving unit DR2 is stopped with a higher gate voltage Vg.

Therefore, the voltage VC3 is set to be higher than a difference voltage obtained by subtracting the threshold voltage Vth3 of PMOS3 from the threshold voltage Vth1 of the switching device SW1. As a result, the second driving unit DR2 stops discharging of charges before the gate voltage of the switching device SW1 has reached the threshold voltage Vth1.

FIGS. 7A to 7D show a timing chart of an operation of the semiconductor module according to the third embodiment. FIG. 7A shows a waveform of an input signal IN for turning off the switching device SW1, FIG. 7B shows a gate bias waveform of the switching device SW1, FIG. 7C shows a gate bias waveform in the case of only the first driving unit DR1, FIG. 7D shows a gate bias waveform in the case of only the second driving unit DR2, and the waveform of FIG. 7B is the sum of the waveform of FIG. 7C and the waveform of FIG. 7D.

When a low signal is input as the input signal IN, the drive circuit 1 performs an operation of turning off the switching device SW1. In the turn-off operation of the switching device SW1, NMOS1 and PMOS3 are turned on, and the gate voltage of the switching device SW1 is lowered. Since both the first and second driving units DR1 and DR2 start to discharge charges accumulated in the gate of the switching device SW1, the period of time from the time when the drive circuit 1 starts discharging until the gate voltage falls below the threshold voltage Vth1 of the switching device SW1 is shortened. As a result, the switching loss can be reduced.

Thereafter, even when the gate voltage decreases and has reached the threshold voltage Vth1, the first driving unit DR1 continues to discharge charges. On the other hand, the second driving unit DR2 stops discharging of charges before the gate voltage has reached the threshold voltage Vth1. Therefore, the decreasing speed of the gate voltage when the gate voltage falls below the threshold voltage Vth1 is the same as that in the case of only the first driving unit DR1. Accordingly, the gate voltage slowly falls below the threshold voltage Vth1 when the switching device SW1 is turned off. As a result, switching noise occurring when the switching device SW1 is turned off can be suppressed.

Fourth Embodiment

FIG. 8 is a circuit diagram showing a semiconductor module according to a fourth embodiment. Unlike the third embodiment, the reference potential of INV3 is not the output potential of the power supply 4, but GND of the drive circuit 1. A voltage dividing circuit in which resistors R3 and R4 are connected in series to each other is provided between the output of INV3 and the power supply 2 of the drive circuit 1. The connection point between the resistors R3 and R4 is connected to the gate of PMOS3. Other configurations are the same as those in the third embodiment.

The voltage at the connection point between the resistors R3 and R4 is higher than the GND potential of the drive circuit 1. The voltage at the connection point between the resistors R3 and R4 is set to be higher than a difference voltage obtained by subtracting the threshold voltage Vth3 of PMOS3 from the threshold voltage Vth1 of the switching device SW1. As a result, the second driving unit DR2 stops discharging of charges before the gate voltage of the switching device SW1 has reached the threshold voltage Vth1. Therefore, the same effect as the third embodiment can be obtained. Furthermore, since it is not necessary the power supply 4 is separately provided like the third embodiment, the circuit configuration is more simplified. Furthermore, by setting the resistance values of the resistors R3 and R4 to appropriate values, a voltage corresponding to the voltage VC3 of the power supply 4 can be easily set.

The switching devices SW1 and SW2 are not limited to devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2019-127043, filed on Jul. 8, 2019 including specification, claims, drawings and summary, on which the convention priority of the present application is based, is incorporated herein by reference in its entirety.

The invention claimed is:

1. A driving circuit comprising first and second driving units connected in parallel to each other,
   wherein both the first and second driving units are controlled by an input signal to start to supply a gate current to a gate of a switching device in a turn-on operation of the switching device,
   when a gate voltage of the switching device increases and has reached a threshold voltage of the switching device, the first driving unit continues to supply the gate current,
   the second driving unit stops supply of the gate current before the gate voltage has reached the threshold voltage, and
   when the gate voltage exceeds the threshold voltage of the switching device, the switching device is switched from an off-state to an on-state.

2. The driving circuit according to claim 1, wherein the second driving unit includes an NMOS transistor, and a preamplifier for driving the NMOS transistor, and a high output voltage of the preamplifier is lower than a total voltage obtained by summing the threshold voltage of the switching device and a threshold voltage of the NMOS transistor.

3. The driving circuit according to claim 2, wherein the second driving unit includes a power supply on a high potential side of the preamplifier, and
a voltage of the power supply is lower than the total voltage.

4. The driving circuit according to claim 2, wherein the second driving unit includes first and second resistors connected in series between an output of the preamplifier and a reference potential, and
a connection point between the first resistor and the second resistor is connected to a gate of the NMOS transistor.

5. A semiconductor module comprising:
the switching device; and
the driving circuit according to claim 1.

6. The semiconductor module according to claim 5, wherein the switching device is made of a wide-band-gap semiconductor.

7. A driving circuit comprising first and second driving units connected in parallel to each other,
wherein both the first and second driving units start to discharge a charge accumulated in a gate of a switching device in a turn-off operation of the switching device,
when a gate voltage of the switching device decreases and has reached a threshold voltage of the switching device, the first driving unit continues to discharge the charge,
the second driving unit stops discharging of the charge before the gate voltage has reached the threshold voltage, and
when the gate voltage exceeds the threshold voltage of the switching device, the switching device is switched from an off-state to an on-state.

8. The driving circuit according to claim 7, wherein the second driving unit includes a PMOS transistor, and a preamplifier for driving the PMOS transistor, and
a low output voltage of the preamplifier is higher than a difference voltage obtained by subtracting a threshold voltage of the PMOS transistor from the threshold voltage of the switching device.

9. The driving circuit according to claim 8, wherein the second driving unit includes a power supply on a low potential side of the preamplifier, and
a voltage of the power supply is higher than the difference voltage.

10. The driving circuit according to claim 8, wherein the second driving unit includes first and second resistors connected in series between an output of the preamplifier and a power supply on a high potential side, and
a connection point between the first resistor and the second resistor is connected to a gate of the PMOS transistor.

11. A semiconductor module comprising:
the switching device; and
the driving circuit according to claim 7.

12. The semiconductor module according to claim 11, wherein the switching device is made of a wide-band-gap semiconductor.

13. A driving circuit comprising first and second driving units connected in parallel to each other,
wherein both the first and second driving units start to supply a gate current to a gate of a switching device in a turn-on operation of the switching device,
when a gate voltage of the switching device increases and has reached a threshold voltage of the switching device, the first driving unit continues to supply the gate current, and
the second driving unit stops supply of the gate current before the gate voltage has reached the threshold voltage, and
wherein
the second driving unit includes an NMOS transistor, and a preamplifier for driving the NMOS transistor, and
a high output voltage of the preamplifier is lower than a total voltage obtained by summing the threshold voltage of the switching device and a threshold voltage of the NMOS transistor.

14. The driving circuit according to claim 13, wherein the second driving unit includes a power supply on a high potential side of the preamplifier, and
a voltage of the power supply is lower than the total voltage.

15. The driving circuit according to claim 13, wherein the second driving unit includes first and second resistors connected in series between an output of the preamplifier and a reference potential, and
a connection point between the first resistor and the second resistor is connected to a gate of the NMOS transistor.

* * * * *